United States Patent [19]

Burke et al.

[11] 4,241,421
[45] Dec. 23, 1980

[54] SOLID STATE IMAGING APPARATUS

[75] Inventors: Hubert K. Burke, Scotia; Gerald J. Michon, Waterford, both of N.Y.

[73] Assignee: General Electric Company, Schenectady, N.Y.

[21] Appl. No.: 60,850

[22] Filed: Jul. 26, 1979

[51] Int. Cl.³ .................. G11C 11/40; G11B 11/08
[52] U.S. Cl. .................. 365/183; 365/114; 358/298; 250/211 J
[58] Field of Search ............ 365/114, 183; 358/298; 250/211 J; 357/24

[56] References Cited

U.S. PATENT DOCUMENTS

| | | | |
|---|---|---|---|
| 3,935,446 | 1/1976 | Michon | 250/211 J |
| 3,958,210 | 5/1976 | Levine | 365/183 |
| 3,988,613 | 10/1976 | Brown et al. | 250/211 J |
| 3,993,897 | 11/1976 | Burke et al. | 250/211 J |
| 4,000,418 | 12/1976 | Waldron et al. | 250/211 J |
| 4,011,441 | 3/1977 | Michon et al. | 357/24 |
| 4,085,456 | 4/1978 | Tompsett | 365/183 |

*Primary Examiner*—Terrell W. Fears
*Attorney, Agent, or Firm*—Julius J. Zaskalicky; James C. Davis, Jr.; Marvin Snyder

[57] ABSTRACT

An array of charge storage devices each including a pair of closely coupled conductor-insulator-semiconductor cells, one a row line connected cell and the other a column line connected cell, is provided on a common semiconductor substrate. Readout of the charges stored in a row of devices is accomplished by transferring the charge in each of the devices of the selected row of devices in one direction between the row line connected cell and the column line connected cells of a device in sequence and sensing the resultant current flow in the row line of the selected row of devices.

4 Claims, 49 Drawing Figures

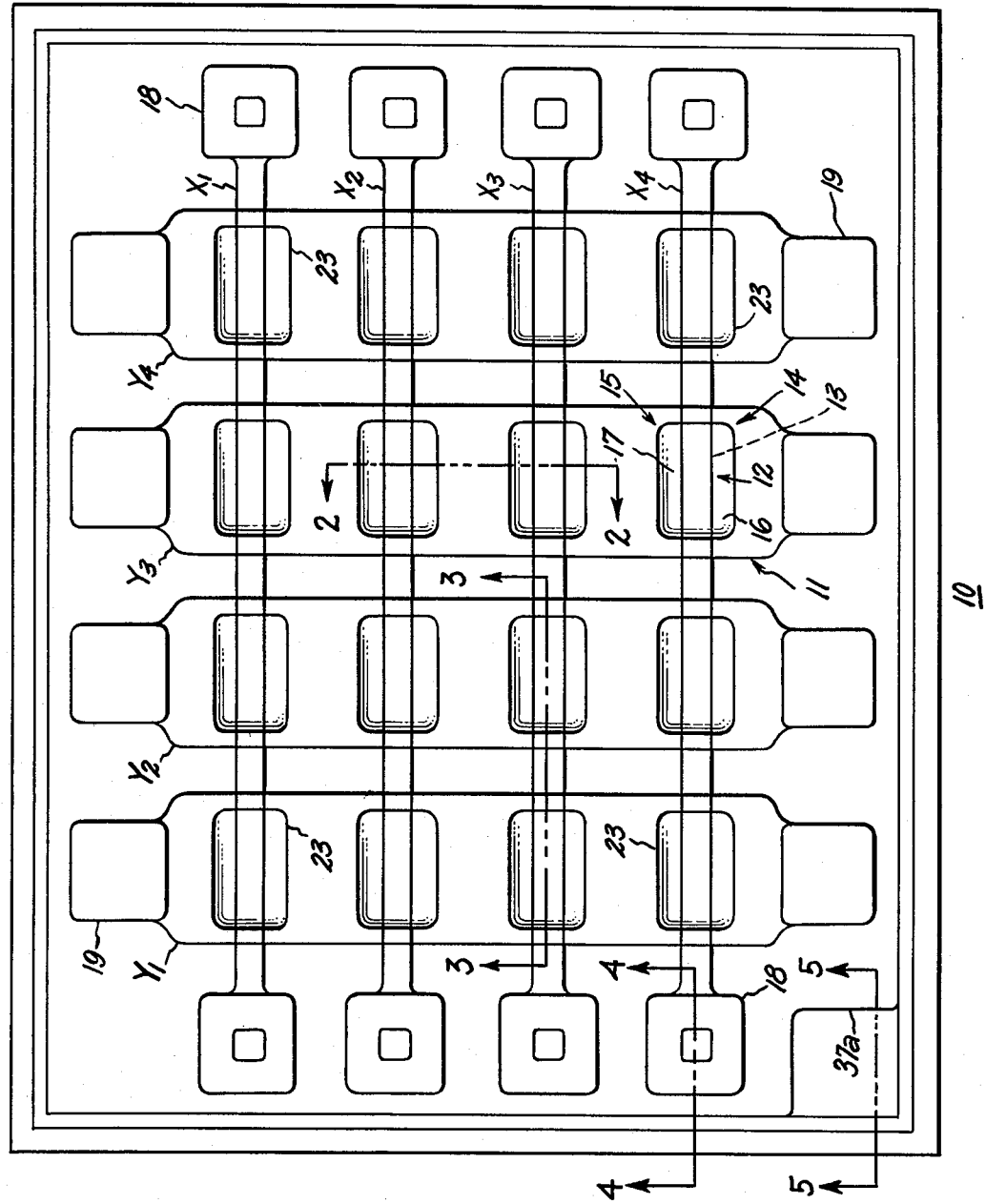

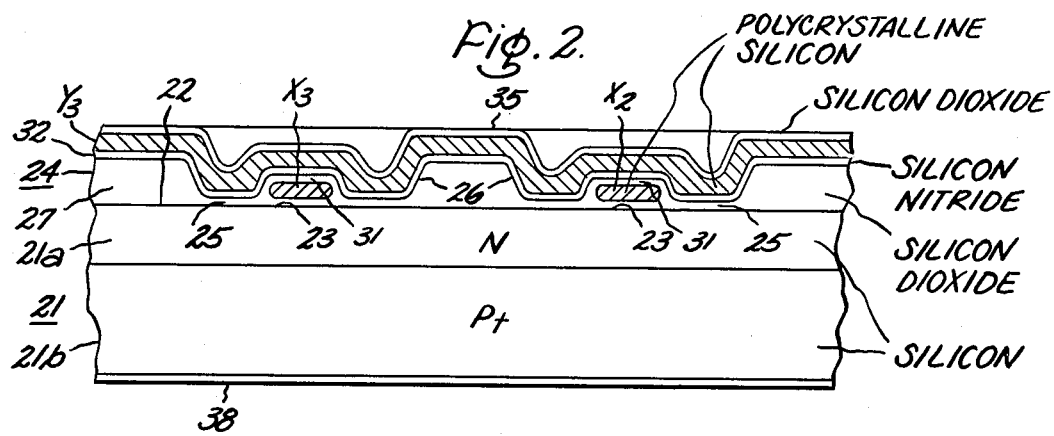
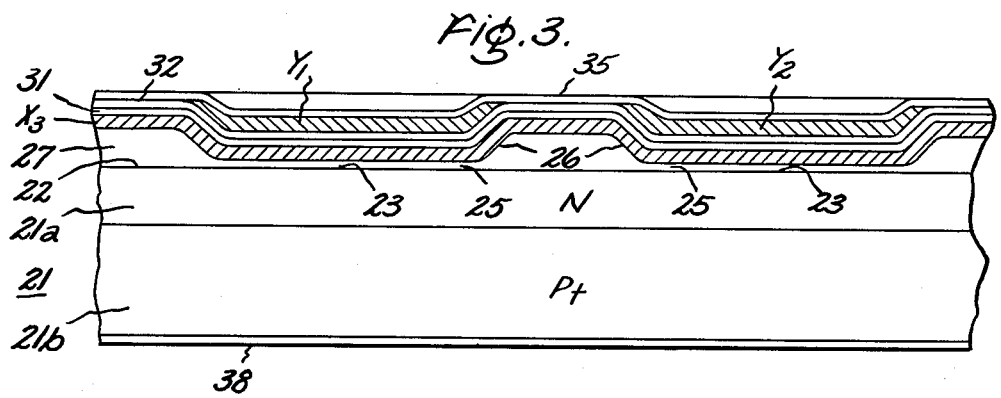
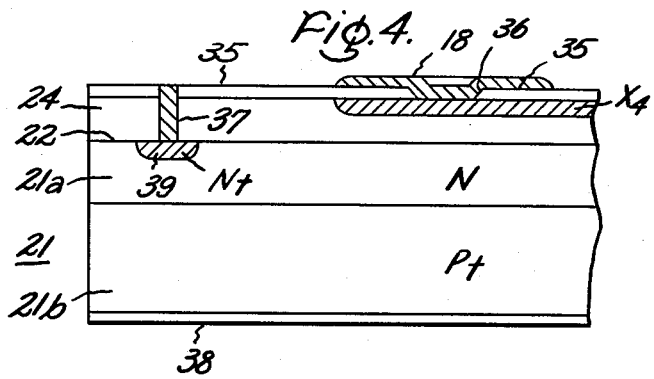
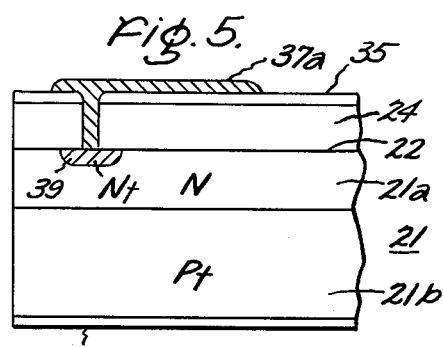

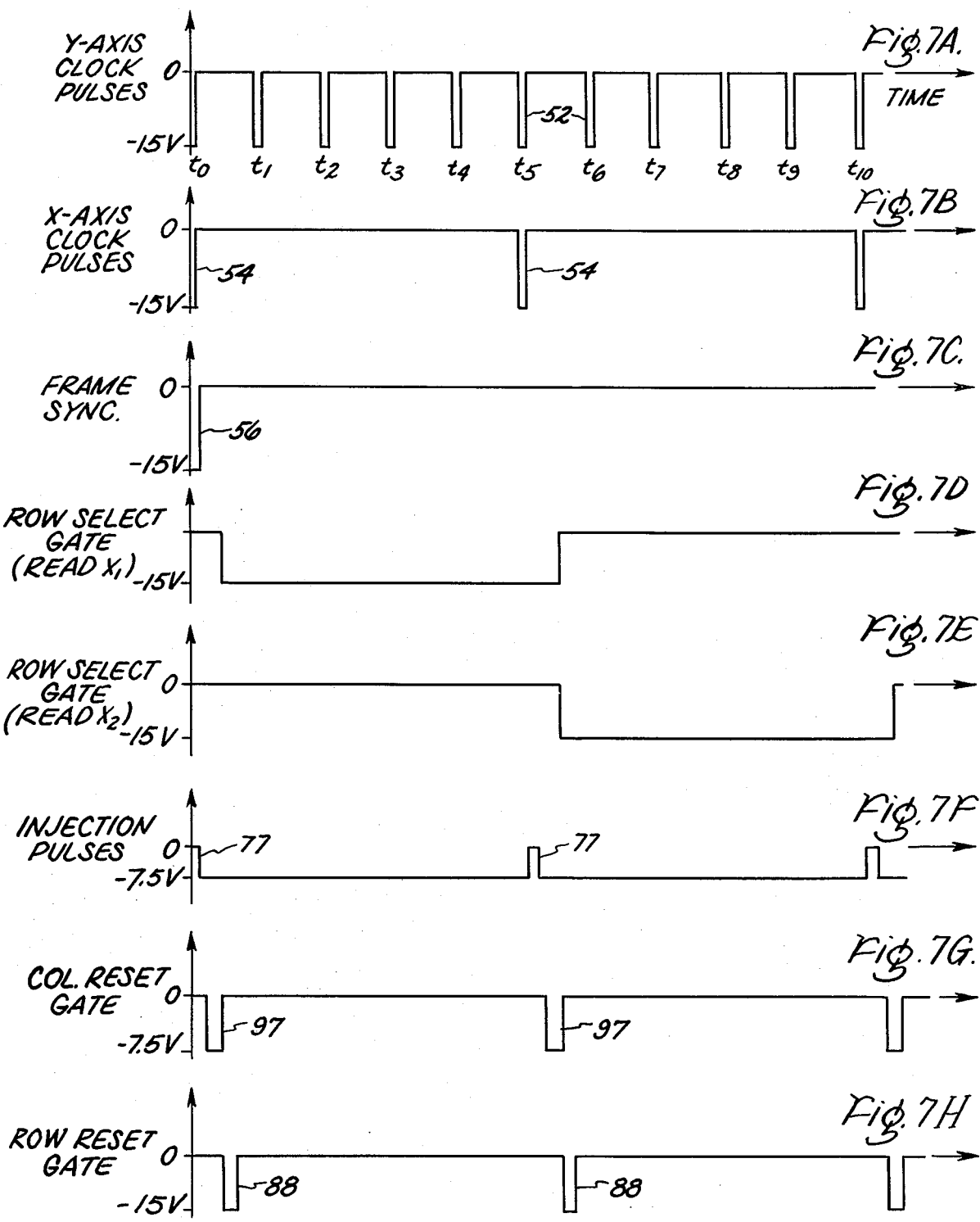

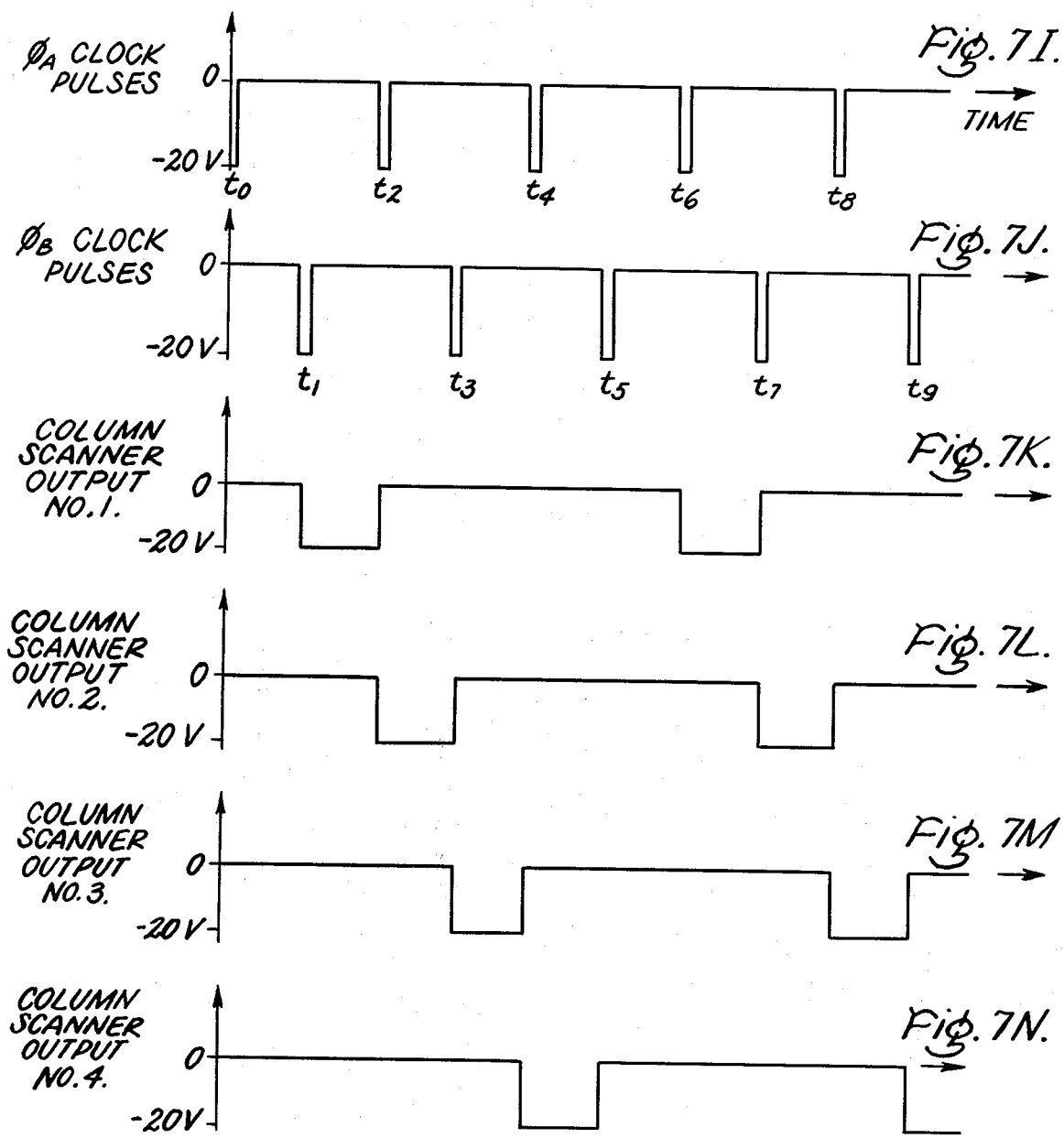

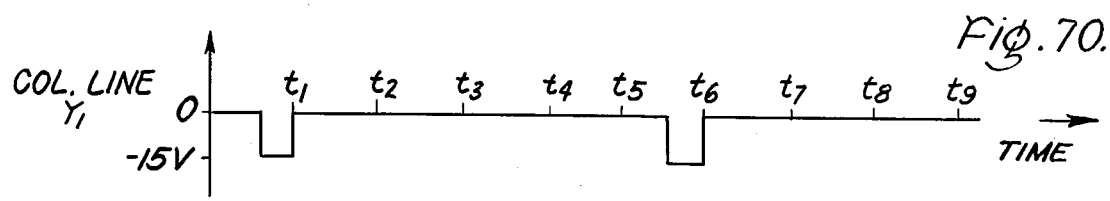
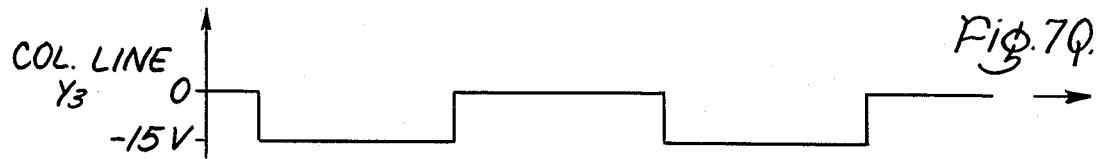
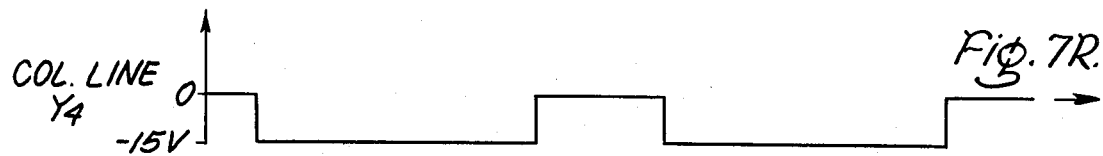
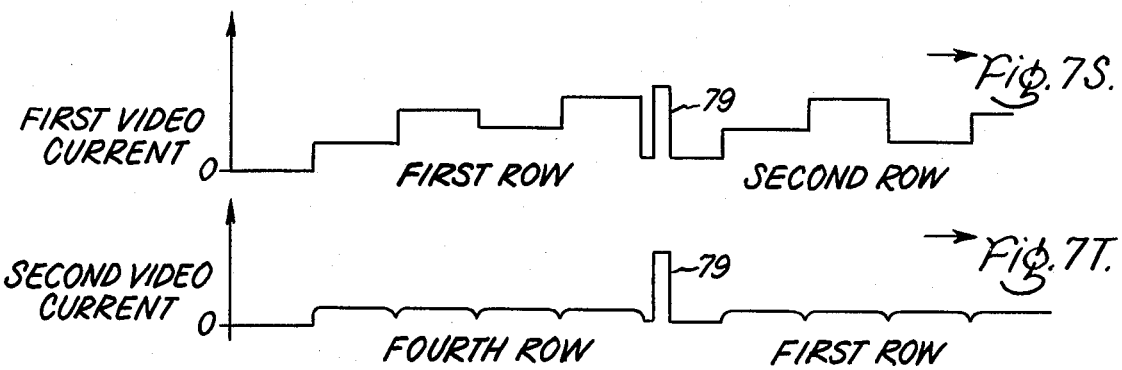
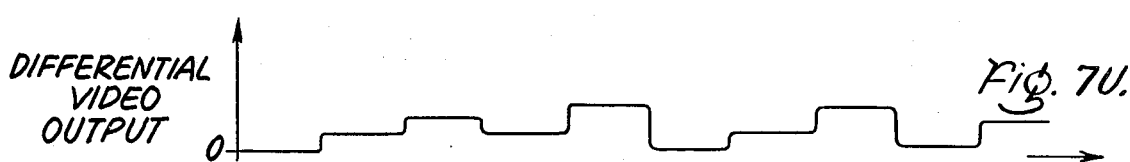

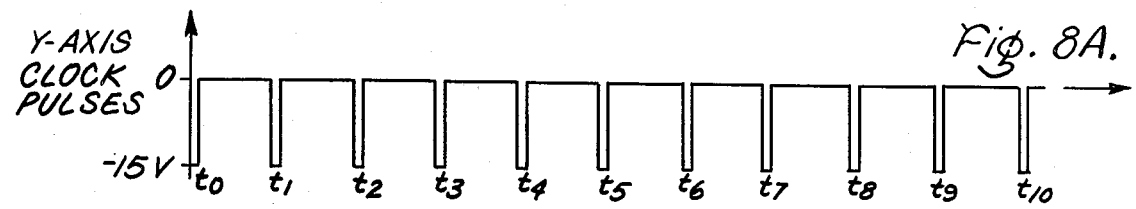
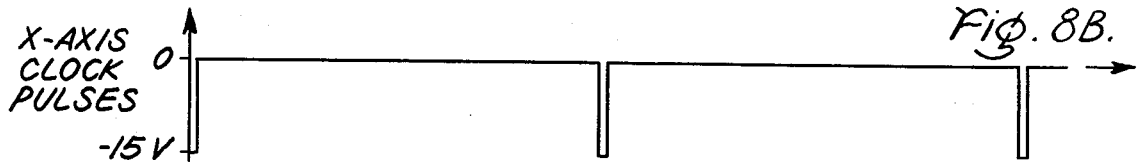
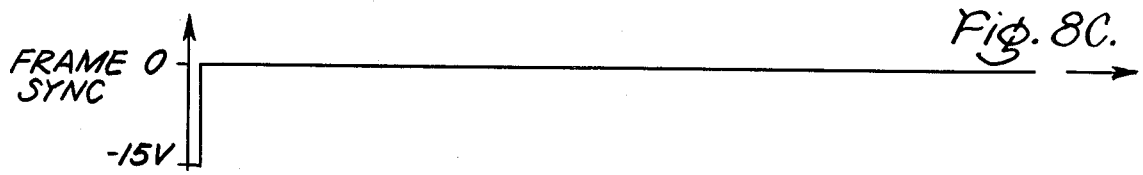
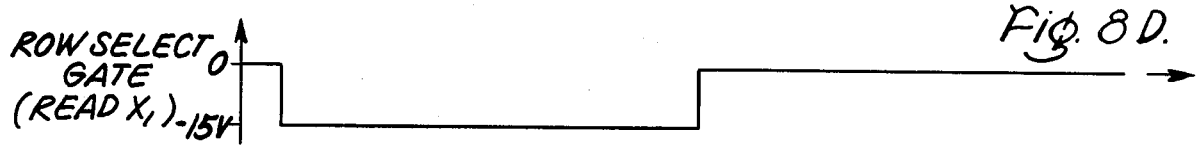
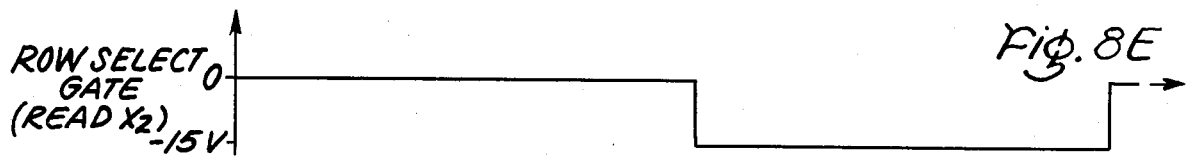
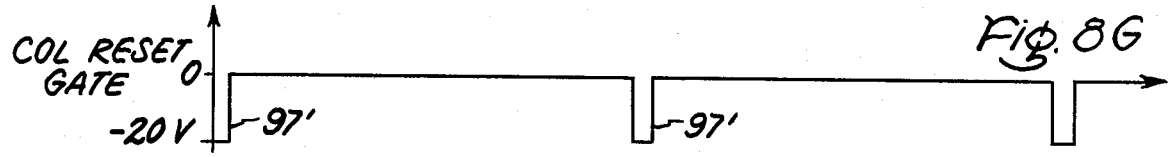
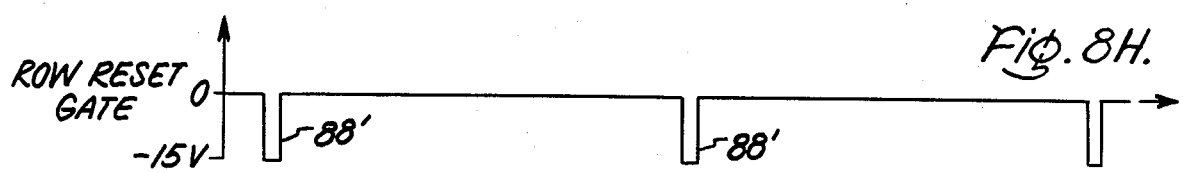

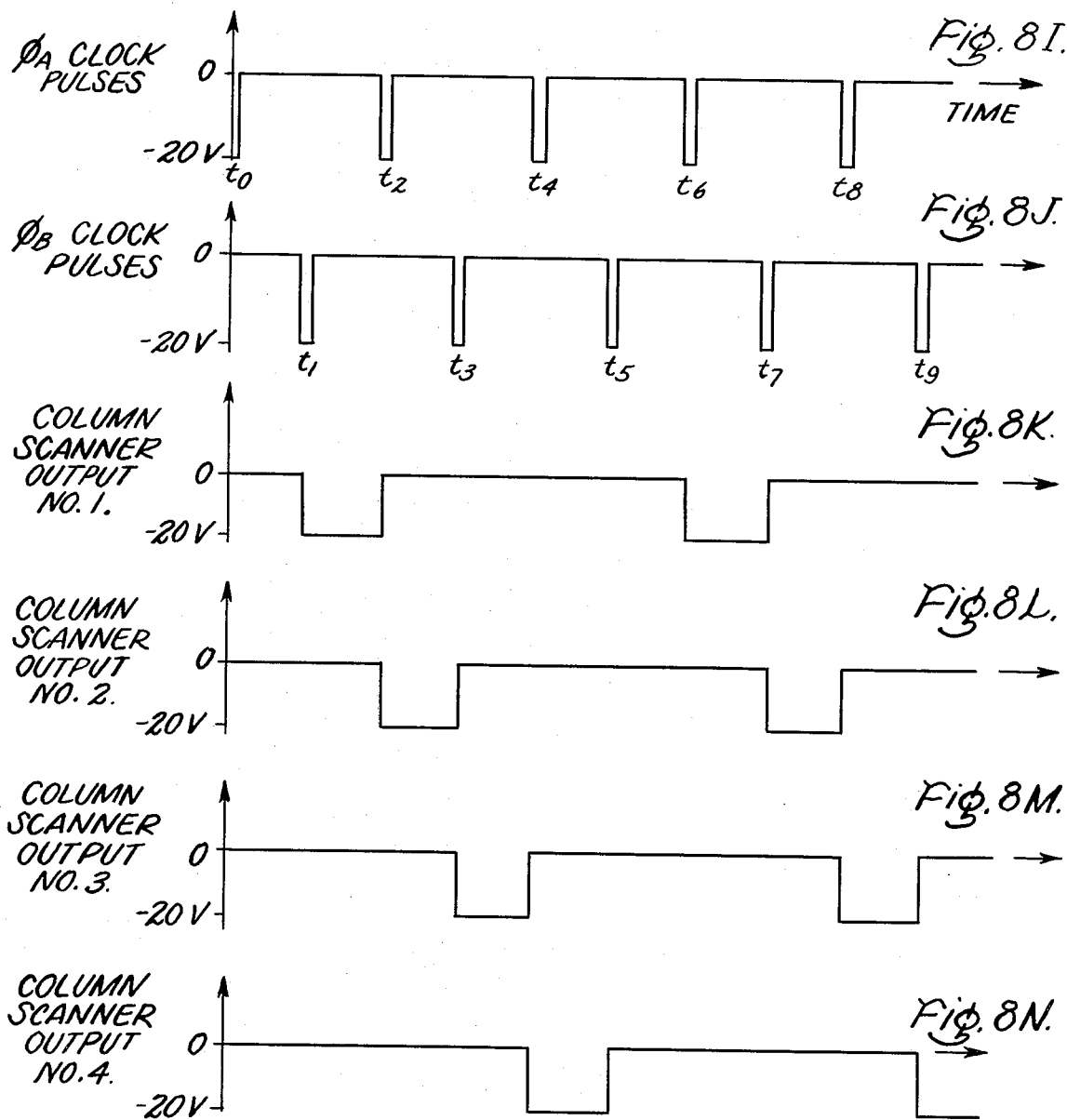

SOLID STATE IMAGING APPARATUS

The present invention relates to apparatus including devices and circuits therefor for sensing patterns of radiation imaged thereon and developing electrical signals in accordance therewith. The present invention relates in particular to such apparatus which stores charge produced by electromagnetic radiation flux in the form of localized charges in a semiconductor substrate and which provides an electrical readout of the stored charge.

This application relates to improvements in the apparatus of U.S. Pat. Nos. 3,993,897 and 4,000,418, both of which are assigned to the assignee of the present application.

A general object of the present invention is to provide improvements in solid state imaging apparatus.

Another object of the present invention is to simplify the structure and organization of solid state imaging apparatus and improve the performance thereof.

Another object of the present invention is to reduce the signal processing bandwidth requirement for a given rate of picture element readout of the array.

A further object of the present invention is to increase the dynamic range of solid state imaging apparatus.

In carrying out the invention in one illustrative embodiment thereof there is provided a substrate of semiconductor material of one conductivity type having a major surface. A plurality of first conductive plates are provided, each overlying and in insulated relationship to the major surface and forming a first conductor-insulator-semiconductor capacitor with the substrate. A plurality of second conductive plates are provided, each adjacent a respective first conductive plate to form a plurality of pairs of plates, the pairs of plates being arranged in a matrix of rows and columns, each of the second conductive plates overlying and in insulated relationship to the major surface and forming a second conductor-insulator-semiconductor capacitor with the substrate. Each second conductor-insulator-semiconductor capacitor is coupled to a respective first conductor-insulator-semiconductor capacitor so as to permit the transfer of stored charge between them. A plurality of row conductor lines are provided. The first conductive plates in each of the rows are connected to a respective row conductor line. A plurality of column conductor lines are provided. The second conductive plates in each of the columns are connected to a respective column conductor line.

A first voltage means provides a first voltage between the row conductor lines and the substrate to deplete the first portions of the substrate lying under the first conductive plates of majority charge carriers and provides an absolute potential of a first value therein. A second voltage means provides a second voltage between the column conductor lines and the substrate to deplete the second portions of the substrate lying under the second conductive plates of majority charge carriers and provides an absolute potential of a second value therein. Preferably, the second value of potential is greater than the first value of potential. Means are provided for storing charge in the second portions of the substrate. Means are provided for addressing each pair of adjacent rows in sequence during a respective first period of time, each row being included in two successive pairs of rows whereby each row is addressed during an initial first period and also during a succeeding first period.

Means are provided for decreasing the second voltage on each of the column conductor lines in sequence during an initial first period for an addressed row to a zero reference level whereby charge stored in each pair of second portions of the addressed pair of rows is transferred into a respective pair of first portions thereof. Means are provided for decreasing the first voltage on each of the row lines of the addressed pair to zero reference level for an interval at the end of the initial first period thereof to cause charge in the first portions associated therewith to be injected into the substrate. Means are provided for reestablishing the second voltage on the column conductor lines at the end of each of the initial first periods after the aforementioned interval thereof.

Means are provided for sensing in sequence the signals induced on each of the row lines of the addressed pair during the transfer of charge from the second portions to the first portions of the substrate associated therewith. Means are provided for obtaining a difference signal for each pair of signals appearing on the row lines of the addressed pair of rows.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

FIG. 1 is a plan view of an array or assembly of charge storage devices incorporated in the apparatus of the present invention shown in FIG. 6.

FIG. 2 is a sectional view of the assembly of FIG. 1 taken along section lines 2—2 of FIG. 1.

FIG. 3 is a sectional view of the assembly of FIG. 1 taken along section lines 3—3 of FIG. 1.

FIG. 4 is a sectional view of the assembly of FIG. 1 taken along section lines 4—4 of FIG. 1.

FIG. 5 is a sectional view of the assembly of FIG. 1 taken along section lines 5—5 of FIG. 1.

FIGS. 7A–7U are diagrams of amplitude versus time of voltages and currents occurring at various points in the apparatus of FIG. 6. The point of occurrence of a signal of FIGS. 7A–7U in the block diagram of FIG. 6 is identified in FIG. 6 by a literal designation corresponding to the literal designation of the FIGS. 7A–7U.

FIG. 9 shows a modification of the apparatus of FIG. 6.

Figure 6:
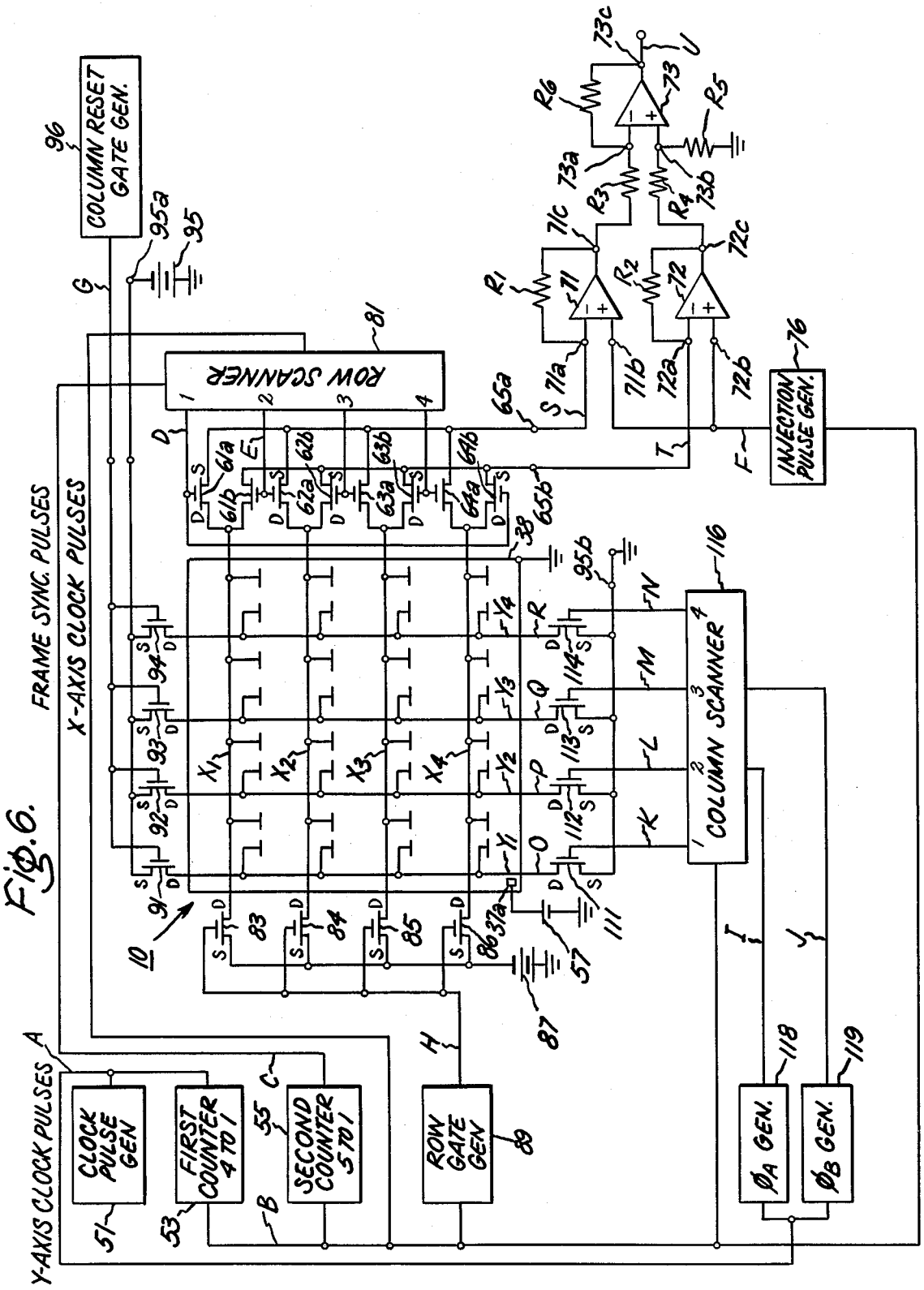
FIG. 6 is a block diagram of an image sensing apparatus in accordance with the present invention.

Before proceeding to describe the apparatus of FIG. 6 embodying the present invention an array 10 of charge storage and radiation sensing devices used in the apparatus and shown in FIGS. 1–5 will be described. Such image sensing arrays are described in U.S. Pat. No. 3,988,613. The image sensing array 10 includes a plurality radiation sensing devices 11 each of which includes a first or row CIS (Conductor-Insulator-Semiconductor) charge storage capacitor 12 of generally rectangular outline and a pair of column CIS charge storage capacitors 14 and 15, collectively designated as a second charge storage capacitor, also of generally rectangular outline, each adjacent a respective side of the row CIS charge storage capacitor 12. The plate or conductor 13 of capacitor 12 is connected to and integral with a row conductor line of the row in which the device is located. The plates or conductors 16 and 17 of capacitors 14 and 15 are connected to and are integral with the column conductor line of the column in which the device is located. The radiation sensing devices 11 are arranged in four rows and four columns. The array 10 includes four row conductor lines, each connecting the row plates of a respective row of devices, and are designated from top to bottom $X_1$, $X_2$, $X_3$ and $X_4$. The array also includes four column conductor lines orthogonally oriented with respect to the row conductor lines, each connecting the column plates of a respective column of devices, and are designated from left to right $Y_1$, $Y_2$, $Y_3$ and $Y_4$. The row lines are constituted of a light transmissive conductive material, such as doped polycrystalline silicon and the column lines are also constituted of the same light transmissive conductive material, doped polycrystalline silicon. Conductive connections are made to the row lines $X_1$-$X_4$ through conductive landings or contacts 18 provided at both ends of each of the row lines. Conductive connections are made to the column lines $Y_1$-$Y_4$ through conductive landings or contacts 19 provided at both ends of each of the column lines.

The array includes a substrate or wafer 21 of silicon semiconductor material having a high resistivity layer 21a of N type conductivity epitaxially formed on a low resistivity base layer 21b of P type conductivity. The layer 21a has a major surface 22 in which are provided a plurality of surface regions 23. The surface regions 23 are arranged in a plurality of rows and columns. The surface regions 23 are of substantially identical area and outline. As shown, the surface regions 23 are of generally rectangular outline with the long sides parallel to the row direction and the short sides parallel to the column direction. A thick layer 24 of light transmissive insulating material such as silicon dioxide overlies the major surface and has a plurality of thin portions 25, each in registry with a respective one of the surface regions 23. The thin portions are provided by forming deep recesses 26 in the thick insulating layer. Thus, the insulating layer 24 includes thick or ridge portions 27 surrounding a plurality of thin portions 25 in the bottoms of the recesses 26. A plurality of row conductor lines $X_1$-$X_4$ each of the same and uniform width are provided overlying the layer of insulation. Each row conductor line being in traversing relationship to the surface regions 23 of a respective row of surface regions and overlying fixed first portions of the surface region of the respective row. The portions of the row conductor lines overlying the surface regions 23 constituting the conductors of a plurality of first conductor-insulator-semiconductor capacitors formed with the insulating layer 25 and the substrate 21. A plurality of column conductor lines $Y_1$-$Y_4$ each of the same and uniform width are provided insulatingly overlying the row conductor lines. Each column conductor line being in traversing relationship to the surface regions 23 of a respective column of surface regions and overlying entirely the surface regions of the respective column. The portions of the column conductor lines overlying the surface regions not shielded or masked by the row conductor lines constituting the split conductors 16 and 17 of a plurality of second conductor-insulator-semiconductor capacitors formed with the thin portions 25 of the insulating layer and the substrate. Each second conductor-insulator-semiconductor capacitor include a pair of capacitors 14 and 15 both of which are coupled to a respective first conductor-insulator-semiconductor capacitor 12.

A thin insulating layer 31 of silicon dioxide surrounds the row lines $X_1$-$X_4$ of polycrystalline silicon. A thin layer of silicon nitride 32 is provided between the column lines $Y_1$-$Y_4$ and the row lines $X_1$-$X_4$. A thin layer of silicon dioxide 35 is formed over the upper face of the array including the column conductor lines $Y_1$-$Y_4$.

The contacts 18 to the polycrystalline silicon row lines are made through openings 36 in the protective layer 35 as shown in FIG. 4 filled with a conductor such as aluminum. The aluminum is sintered to provide good bonds to the polycrystalline silicon lines $X_1$-$X_4$. The contacts 19 of aluminum for the column lines are similarly made to the column lines $Y_1$-$Y_4$. To provide conductive connection to the epitaxial layer 21a an opening 37 is made in the silicon dioxide layers 24 and 35 in registry with an N+ surface adjacent region 39 around the periphery of the layer 21a as shown in FIG. 5. The opening is filled with a conductor such as aluminum which is sintered to N+ region and terminated in contact 37a. A conductive electrode 38 of a suitable material such as aluminum is applied to the other major face of the substrate 21 to provide an ohmic connection thereto.

The array 10 and the devices 21 of which they are comprised may be fabricated using a variety of materials and in variety of sizes in accordance with established techniques for fabricating integrated circuits as described in the aforementioned U.S. Pat. Nos. 3,988,613 and 3,993,897.

Referring now to FIG. 6 there is shown a block diagram of apparatus, utilizing the charge storage array of FIGS. 1-5, which provides a video signal in response to radiation imaged on the array by a lens system (not shown), for example.

The apparatus will be described in connection with FIGS. 7A-7U which show diagrams of amplitude versus time of signals occurring at various points in the apparatus of FIG. 6. The point of occurrence of a signal of FIGS. 7A-7U is referenced in FIG. 6 by a literal designation corresponding to the literal designation of the figure reference.

The apparatus includes a clock pulse generator 51 which develops a series of regularly occurring Y-axis pulses 52 of short duration shown in FIG. 7A, occurring in sequence at instants of time $t_0$-$t_{10}$ and representing a half scanning cycle of operation of the array. The output of the clock pulse generator 51 is applied to a first counter 53 which divides the count of the clock pulse generator by four to derive X-axis clock pulses 54, such as shown in FIG. 7B. The output of the first counter 53 is also applied to a second counter 55 which further divides the count applied to it by five to provide frame synchronizing pulses 56 to the array.

The sensing array 10, which is identical to the sensing array of FIGS. 1-5 and is identically designated, includes row conductor lines $X_1$-$X_4$ and the column conductor lines $Y_1$-$Y_4$. The drive circuits for the row conductor lines $X_1$-$X_4$ and for the column conductor lines $Y_1$-$Y_4$ of array 10 are included on the same substrate 21 as the array to minimize the number of external connections which are required to be made for connection of the array 10 into the apparatus.

In the operation of the apparatus the epitaxial layer 21a is biased by a source 57 at a small positive voltage, for example 2 volts, with respect to the P type layer 21b so that charge injected into layer 21a from a scanned row of devices is rapidly removed from this layer and recollection thereof avoided on reestablishment of storage voltages on the devices of that row. Such a structure enables the array to be operated at higher speeds as injected charge is rapidly removed from the epitaxial layer. Injection of stored charge in a device is accomplished by raising the row connected plate and the column connected plate thereof to zero volts for a short period of time. During injection of stored charge as the plates of the device are at a small negative voltage with respect to the layer 21a a bias charge is retained in the device. Operating the array with such bias charge eliminates noise which would be produced by the emptying and filling the surface states of the layer 21a in the operation.

To enable selective readout of a row of devices a plurality of pairs of row-enable switches $61_a$–$64_a$ and $61_b$–$64_b$ are provided. The row-enable switches $61_a$–$64_a$ and $61_b$–$64_b$ are in the form of MOSFET transistor devices formed integrally on the substrate, each having a source electrode, a drain electrode and a gate electrode. Each of the drains of devices $61_a$–$64_a$ and each of the drains of the devices of $61_b$–$64_b$ is connected to one end of a respective one of the row conductor lines $X_1$–$X_4$. Each of the sources of the devices $61_a$–$64_a$ is connected to row bias terminal $65_a$. Each of the sources of devices $61_b$–$64_b$ is connected to row bias terminal $65_b$.

The output terminal 65a is connected to the noninverting terminal 71a of differential amplifier 71. The output terminal 65b is connected to the inverting terminal 72a of differential amplifier 72. The non-inverting terminals 71b and 72b are connected to the output of injection pulse generator 76 which is synchronized with X-axis pulses to provide injection pulses 77 from a base line level of $-7\frac{1}{2}$ volts, as shown in FIG. 6G, at the output thereof. (A change in voltage at the inverting terminal of a differential amplifier in one direction in relation to a referenced potential produces a change in voltage at the output terminal in the opposite direction in relation to the referenced potential. A change in voltage at the non-inverting terminal in one direction in relation to a referenced potential produces a change in voltage at the output terminal in the same direction in relation to the referenced potential.) Feedback resistor $R_1$ connected between the output terminal 71c and the input terminal 71a of differential amplifier 71 provides a voltage signal at output terminal 71c in response to a current signal appearing at input terminal 71a. Similarly, feedback resistor $R_2$ connected between the output terminal 72c and input terminal 72a of differential amplifier 72 provides an output voltage at output terminal 72c corresponding to a current input at input terminal 72a. Thus, in the absence of an injection pulse appearing at the output of injection pulse generator 76 the potential appearing at terminals 65a and 65b are equal to the row line potential of $-7\frac{1}{2}$ volts. On the appearance of injection pulses 77 the potential on non-inverting terminals 71b and 72b is raised to zero and accordingly the potential on the row lines to which the terminals 65a and 65b are connected also rise to zero potential and cause injection of charge stored in the devices of these rows to occur, as will be explained below in more detail.

A differential amplifier 73 having an inverting terminal 73a, a non-inverting terminal 73b and an output terminal 73c is provided for obtaining the difference in the signals appearing at the output terminal 71c and 72c of differential amplifiers 71 and 72, respectively. Output terminal 71c is connected through a series resistance $R_3$ to the inverting input terminal 73a and the output terminal 72c is connected through series resistance $R_4$ to the non-inverting input terminal 73b. Resistance $R_5$ is connected between the non-inverting terminal 73b and ground and a feedback resistance $R_6$ is connected between the output terminal 73c and the input terminal 73a. Thus, at the output terminal 73c appears a voltage signal corresponding to the difference in outputs at terminals 71c and 72c.

The gate electrodes of the transistor pairs 61a and 64b, 62a and 61b, 63a and 62b, 64a and 63b are connected to successive output terminals of the row shift register 81, numbered respectively 1, 2, 3 and 4. The outputs at terminals 1 and 2 of the row shift register are shown, respectively, in FIGS. 7D and 7E. The outputs at terminals 3 and 4 are similar to output of terminal 1 except appropriately delayed in time to occur during the third and fourth row line scan periods, respectively. The input to row shift register 81, referred to as the frame sync pulse, is the pulse obtained at the output of the second counter 55. One frame sync pulse occurs for every twenty Y-axis clock pulses. Oppositely phased clock drive pulses for the row shift register 81 are derived from the X-axis clock pulses. The oppositely phased drive pulses are applied to each of the stages of the row shift register 81 to produce the indicated outputs at the terminals 1–4 thereof. The row shift register 81 may be any of a number of shift registers known to the art. The elements of the shift register 81 may be formed on the substrate at the same time that the devices of the array 20 are formed.

During the occurrence of the gating pulse of FIG. 7D on terminal 1 of the row scanner 81, transistors 61a and 64b are turned on, connecting row $X_1$ to terminal 65a and connecting row line $X_4$ to terminal 65b. Prior to the instant of time $t_0$, the devices of row $X_4$ have been read out and the charge stored in these devices has been injected into the substrate as will be explained below.

The pulses appearing on the column lines $Y_1$–$Y_4$ to effect readout are shown, respectively in FIGS. 7O–7R. The pulse applied to column line $Y_1$ raises the voltage thereof to zero volts during the interval $t_1$–$t_5$. Similarly the column lines $Y_2$–$Y_4$ are raised to zero volts during intervals $t_2$–$t_5$, $t_3$–$t_5$, $t_4$–$t_5$, respectively. The first device in the first row $X_1$ is read out by the rise in potential of the $Y_1$ line to zero volts which causes charge stored in the column cell to transfer into the row cell of the first device. The transferred charge is sensed on terminal 65a connected to line $X_1$ thru transistor 61A. Simultaneously, any signal on line $X_4$ due to shift in voltage on the column electrode of the first device in the fourth row (which has been emptied of charge at the end of the previous row scan period) is sensed on terminal 65b. As terminal 65a is connected to the inverting terminal 71a of the differential amplifier 71 and as terminal 65b is connected to the inverting terminal 72a of the differential amplifier 72, an output is obtained from the amplifier 73 which is the difference of the two signals. The other devices of the rows $X_1$ and $X_4$ are similarly sensed and differential outputs obtained. This mode of sensing eliminates components in the resultant signals which are due to geometrical non-uniformities in the devices of the array and which are referred to as pattern noise. At the end of the period of scan of the devices of rows $X_1$ and X$_4$, while the column lines are at zero volts the injection pulse 77 of FIG. 7G is applied to the non-inverting terminals 71b and 72b of amplifiers 71 and 72 respectively to raise the potential of the X$_1$ and X$_4$ line to zero to cause the charge stored in rows 4 and 1 to be injected into the substrate. With +2 volts substrate bias on the layer 21a bias charge is maintained in the column and row storage sites of each of the devices of the addressed rows with resultant improved noise performance of the array as pointed out above.

To enable readout of the next row of devices column line and row line voltages must be re-established. The establishment of column line voltage is performed by the column line switches 91–94 in the form of MOSFET transistors integrally formed on the substrate and each having a source electrode, a drain electrode and a gate electrode. Each of the drains of the devices 91–94 is connected to one end of a respective one of the column lines Y$_1$–Y$_4$ and each of the sources is connected to the negative terminal 95a of source 95 the positive terminal of which is connected to ground. Each of the gates of the devices 91–94 is connected to the output of the column reset gate generator 96 at the output of which appear column reset gate pulse 97 of FIG. 7G to re-establish storage voltage on the column lines.

To re-establish storage voltage on all of the row lines, row reset switches 83–86 are provided. The reset switches 83–86 are in the form of MOSFET transistors integrally formed on the substrate 21, each having a drain electrode connected to the other end of a respective one of the row conductor lines X$_1$–X$_4$ and each having a source electrode connected to the negative terminal source 87, the positive terminal of which is connected to ground. Each of the gate electrodes of the transistors 83–86 is driven by common reset pulse 88 shown in FIG. 7H obtained from the output of row gate generator 89 and synchronized with the X-axis clock pulses of FIG. 7B.

Row reset gate pulses 88 appear subsequent to the appearance of column reset gate pulses 97 and coincident with the drop in voltage of row select waveform of FIG. 7E. Thus, all of the row lines are reset and floated with the exception of row lines X$_1$ and X$_2$ which are now connected to the input terminals 71a and 72a of the differential amplifiers 71 and 72 respectively and have voltages thereon substantially the same as appear on the non-inverting terminals 71b and 72b. The devices of the second row are read out in the same manner as the devices of the first row are read out. In this case, however, row line X$_1$ is connected through switch 61b to the inverting terminal 72a of the differential amplifier 72 the row line X$_2$ is connected through transistor 62a to the inverting terminal 71a of the differential amplifier 71. The sensing of the charge stored in the devices of row X$_3$ and row X$_4$ is accomplished in a manner similar to the manner in which the sensing of the charge stored in rows X$_1$ and X$_2$ is accomplished.

The column lines Y$_1$–Y$_4$ are driven to ground in sequence as shown in FIGS. 7O–7R to provide readout of the devices of a row. To this end a plurality of column line drive switches in the form of MOSFET transistors 111–114 are provided. Each of the transistors 111–114 has a drain electrode connected to the other end of a respective one of the column lines Y$_1$–Y$_4$. The source electrodes of the transistors 111–114 are connected to terminal 95b which is connected to ground. The gate electrode of each of the transistors 111–114 is connected to respective ones of terminals 1–4 of column line scanner 116. The outputs provided at terminals 1–4 are shown respectively in FIGS. 7K–7N. These outputs appear in sequence on the gates of transistors 111–114 and raise the potential of lines Y$_1$–Y$_4$ in sequence to zero.

To provide the outputs of FIGS. 7K–7N at the terminals 1–4 of the column scanner 116, line synchronizing pulses from the output of counter 53 are applied to the input of the column scanner 116 and, in addition, pulses from the $\phi_A$ generator 118 and the $\phi_B$ generator 119, shown respectively in FIGS. 7I and 7J, are applied. The $\phi_A$ generator 118 applies the even numbered pulses of the clock pulse generator 51 to the column scanner 116 and the $\phi_B$ generator 119 applies the odd numbered pulses of the clock pulse generator 51 to the column scanner 116. From the applied input information the column scanner develops the outputs 7K–7N at the output terminals 1–4 thereof.

The scanning of the devices of the first and second rows of the array in accordance with the present invention provides a first video signal at terminal 65a as shown in FIG. 7S and also provides a second video signal at terminal 65b as shown in FIG. 7T. On the basis of the assumption that the charge levels in the devices of the first row are in the relative proportions of 1, 3, 2, 4, respectively, and the charge levels of the devices in the second row are in the relative proportions of 2, 4, 1, 3, respectively, the first video current on terminal 65a for the two rows is as shown in FIG. 7S. The first half of the second video current of FIG. 7T shows the signal sensed in the empty devices of the fourth row and the second half of the video signal of FIG. 7T shows the signal sensed in the empty devices of the first row. The differential amplifier 71, 72 and 73 takes the difference of the currents of FIGS. 7S and 7T and provides a differential video output at output terminal 73c shown in FIG. 7U. The pulse 79 appearing in the interval $t_5$–$t_6$ of the video signals of FIGS. 7S and 7T is produced by charge injection at the end of a row of scan and is removed by the differential amplifier 73 as shown in FIG. 7U.

In the operation of the apparatus, the voltage of the row line source 87, which is shown as −7.5 volts, establishes a charge storage capability of the row connected cells of each of the devices of the array and the voltage of the column line source 95 of −15 volts establishes the charge storage capability of the column connected cells of each of the devices of the array. Under the control of the clock pulse generator 51, frame synchronizing pulses, such as shown in FIG. 7C, are applied to the row scanner 81. Line interval gating pulses, two of which are shown for lines X$_1$ and X$_2$ in FIGS. 7D and 7E, respectively, are derived at the output points 1–4 of the row scanner 81 in response to line rate clocking of the row scanner by the X-axis clock pulses of FIG. 7B. The line interval gating pulses are utilized to gate in sequence the pairs of row enable switches 61a and 64b, 62a and 61b, 63a and 62b, 64a and 63b to connect in sequence pairs of row lines X$_1$–X$_4$ to terminals 65a and 65b and hence to the differential amplifiers 71 and 72 for readout.

Consider now the manner in which charge in the first row of devices is read out starting at time $t_1$. Lines X$_4$ and X$_1$ are connected respectively to inverting terminal 72a of differential amplifier 72 and to inverting terminal 71a of differential amplifier 71. The other row lines are at storage voltage of −7.5 volts and all of the column lines Y$_1$–Y$_4$ are at −15 volts. The column lines Y$_1$–Y$_4$ are raised in sequence at times $t_1$–$t_4$ to ground potential as shown in FIGS. 7O–7R by application of the gating pulses of FIGS. 7K–7N in sequence to respective transistors 111–114. The signal current which is caused to flow in row line $X_1$ as a result of this action is shown in FIG. 7S and the signal current which is caused to flow in row line $X_4$ is shown in FIG. 7T. During the interval $t_5$–$t_6$ with the column lines at ground, the row lines $X_1$ and $X_4$ are raised to ground by application of injection pulses 77 of FIG. 7F to the non-inverting terminals 71b and 72b of amplifiers 71 and 72 to inject charge stored in the first and second rows of devices into the substrate. Thereafter, storage potential is reapplied to the column lines $Y_1$–$Y_4$ by application of column reset gate pulse 97 to FIG. 7G to column transistors 91–94. Storage potential is reapplied to the row lines $X_1$–$X_4$ by application of row reset gate pulses 88 of FIG. 7H to row reset transistors 83–86. Concurrently row enable switches 61b and 62a are activated by row select gating waveform of FIG. 7E connecting row lines $X_1$ and $X_2$ to respective inverting terminals 72a and 71a. Readout of devices of the first and second rows is accomplished in the same manner as readout is accomplished in the devices of the fourth and first rows, shown in FIGS. 7S and 7T. The differential of the signal currents appearing on lines $X_1$ and $X_2$ appears at the output of the differential amplifier 73, shown in FIG. 7U.

Figure 8O:
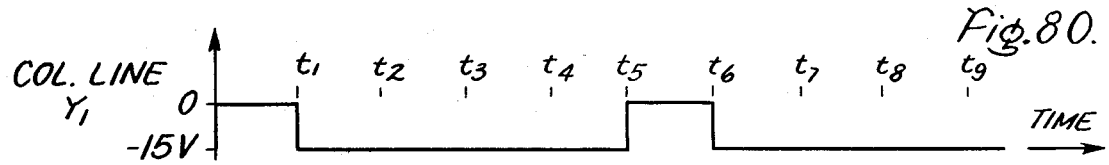
FIGS. 8A–8U are diagrams of amplitude versus time of voltages and currents occurring at various points in the apparatus of FIG. 6 in accordance with another mode of operation thereof.
Figure 8P:
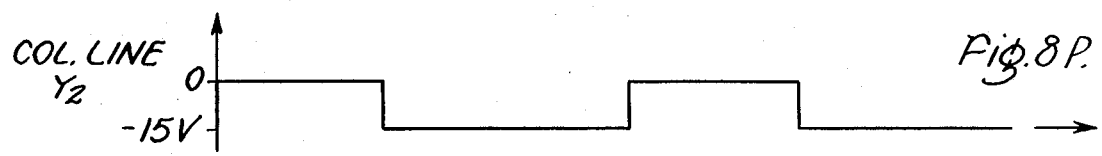
Figure 8Q:
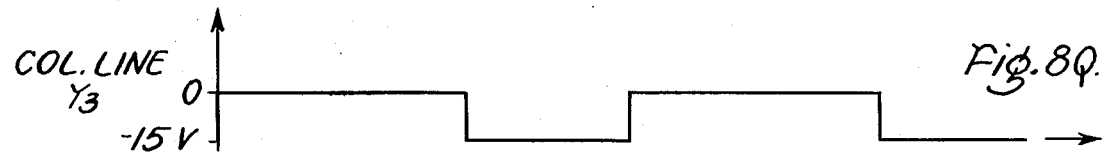
Figure 8R:
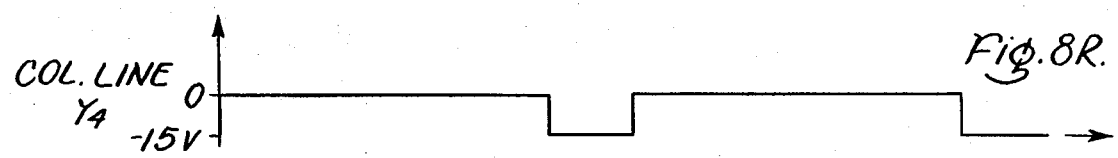
Figure 8S:
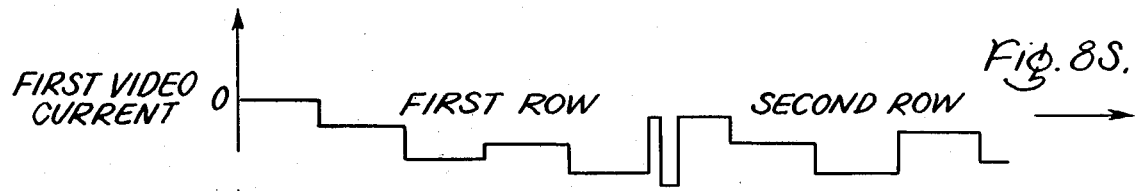
Figure 8T:
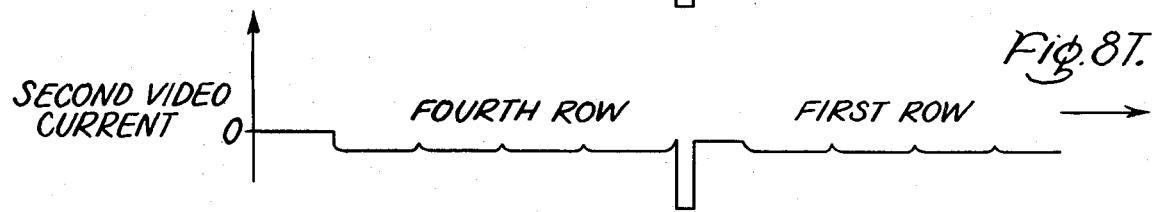
Figure 8U:

In connection with the apparatus of FIG. 6 prior to the readout of an addressed row, charge is stored in the storage regions underlying the column-connected plates of a row and readout is effected by transferring charge from the column-connected storage regions to the row-connected storage regions of that row. In accordance with another embodiment of the present invention, charge may be stored in the storage regions underlying the plates of the row-connected plates of that row and readout effected by transfer of charge in sequence from each of the storage regions underlying a respective row-connected plate of that row of devices to corresponding storage regions underlying column-connected plates of that row. To provide such a mode of operation, the terminal 95a connected to the sources of column reset transistors 91–94 is grounded, and terminal 95b connected to the sources of the column line gating transistors is ungrounded and is connected to bias source 95 which provides the desired storage potential on the column-connected plates to enable transfer of charge from the row-connected storage sites thereto. This mode of operation is depicted in FIGS. 8A–8U similar to FIGS. 7A–7U. FIGS. 8A–8E, and FIGS. 8I–8N are identical to the corresponding FIGS. 7A–7E and FIGS. 7I–7N. The timing of the injection pulses 77' and the column reset gate pulses 97' of FIGS. 7F and 7G is changed so that at the end of a row of scan the column line voltages are brought to zero prior to effecting the raising of the row gate voltage of the addressed rows to zero to effect injection of stored charge. Thus pulse 97' occurs prior to pulse 77'. FIGS. 8O–8R show the waveforms appearing on column lines $Y_1$–$Y_4$, respectively, in response to actuation of column gating transistors 111–114 connecting these column lines in sequence to the bias source 95 at times $t_1$, $t_2$, $t_3$ and $t_4$. As the flow of current in the addressed lines is now a direction opposite to the flow of current in a mode of operation depicted in FIGS. 7A–7U, charge is now transferred in the opposite direction in the devices of an addressed row, and waveforms of FIGS. 8S and 8T produced at the respective input terminals 65a and 65b are opposite in polarity to those shown in FIGS. 7S and 7T. The output of amplifier 73 shown in FIG. 8U is also opposite in polarity to that shown in FIG. 7U.

In the operation of the array of FIG. 6 the column lines are changed in potential in sequence to effect the transfer of charge from a storage site underlying a column-connected plate to a storage site underlying a row-connected plate of the row or rows being addressed. As capacitance coupling exists between each of the column lines and each of the row lines and as capacitance exists between each of the row lines with respect to the substrate and as the unaddressed row lines are floating, each change in voltage of a column produces a corresponding change in the potential on each of the unaddressed row lines. Each such change is proportional to the ratio of the capacitance of the corresponding column line with respect to an unaddressed row line and the capacitance of that row line with respect to the substrate. During the readout of an addressed row the total change in potential of the unaddressed and floating row lines then would be in proportion to the ratio of the capacitance of all of the column lines with respect to that particular row line and the capacitance of the row line with respect to the substrate and may be appreciable. This change in voltage is in a direction to decrease the magnitude thereof and reduce the storage capability of the storage sites underlying the row connected plates of unaddressed rows. This problem may be avoided by clamping each of the unaddressed row lines. To this end the modification illustrated in FIG. 9 is provided. In this figure is shown a row scanner 120 identical to row scanner 81. To the input of the row scanner 120 is provided the frame synchronizing pulses of FIG. 7C from counter 55 and the clocking of the row scanner is done by the X-axis clock pulses of FIG. 7B from counter 53. The outputs 1, 2, 3 and 4 of row scanner 120 are identical to the outputs of row scanner 81. At the output terminals 1, 2, 3 and 4 of scanner 120 are connected respective inverters 121, 122, 123 and 124. The outputs of the inverters 121–124 are connected to the gates of respective row reset transistors 83–86 in place of the output of the row gate generator 89. Thus, the row reset transistors 83–86 connected to the row lines of unaddressed rows are "ON" connecting these row lines to a fixed bias source 87 thereby maintaining fixed potential on these unaddressed row lines.

While the invention has been described in connection with an array of sixteen devices, it is apparent that the invention is particularly applicable to arrays including devices many orders of magnitude greater in number than sixteen.

While the invention has been described in specific embodiments, it will be appreciated that modifications, such as those described above, may be made by those skilled in the art, and it is intended by the appended claims to cover all such modifications and changes as fall within the true spirit and scope of the invention.

What we claim as new and desire to secure by Letters Patent of the United States is:

1. In combination,
   a substrate of semiconductor material having a major surface,
   a plurality of first conductive plates, each overlying and in insulated relationship to said major surface and forming a first conductor-insulator-semiconductor capacitor with said substrate,
   a plurality of second conductive plates, each adjacent a respective first conductive plate to form a plurality of pairs of plates, said pairs of plates being arranged in a matrix of rows and columns, each of said second conductive plates overlying and in insulated relationship to said major surface and forming a second conductor-insulator-semiconductor capacitor with said substrate, each coupled to a respective first conductor-insulator-semiconductor capacitor, a plurality of row conductor lines, the first conductive plates in each of said rows connected to a respective row conductor line, a plurality of column conductor lines, the second conductive plates in each of said columns connected to a respective column conductor line, a first voltage means for providing a first voltage between said row conductor lines and said substrate to deplete the first portions of said substrate lying under said first conductive plates of majority charge carriers and provide an absolute potential of a first value therein, a second voltage means for providing a second voltage between said column conductor lines and said substrate to deplete the second portions of said substrate lying under said second conductive plates of majority charge carriers and providing an absolute potential of a second value therein, said second value being greater than said first value, means for storing charge in said second portions of said substrate, means for addressing each pair of adjacent rows in sequence during a respective first period of time, each row being included in two successive pairs of rows whereby each row is addressed during an initial first period and also during a succeeding first period, means for decreasing said second voltage on each of said column conductor lines in sequence during an initial first period for an addressed row to a zero reference level whereby charge stored in each pair of said second portions of said addressed pair of rows is transferred into a respective pair of first portions thereof, means for decreasing said first voltage on each of the row lines of said addressed pair to zero reference level for an interval at the end of said initial first period thereof to cause charge in said first portions of the substrate associated therewith to be injected into said substrate, means for reestablishing said second voltage on said column conductor lines at the end of each of said initial first periods after said interval thereof, means for sensing in sequence the signals induced on each of the row lines of said addressed pair during the transfer of charge from the second portions to the first portions of said substrate associated therewith, means for obtaining a difference signal for each pair of signals appearing on the row lines of said addressed pair of rows.

2. In combination, a substrate of semiconductor material having a major surface, a plurality of first conductive plates, each overlying and in insulated relationship to said major surface and forming a first conductor-insulator-semiconductor capacitor with said substrate, a plurality of second conductive plates, each adjacent a respective first conductive plate to form a plurality of pairs of plates, said pairs of plates being arranged in a matrix of rows and columns, each of said second conductive plates overlying and in insulated relationship to said major surface and forming a second conductor-insulator-semiconductor capacitor with said substrate, each coupled to a respective first conductor-insulator-semiconductor capacitor, a plurality of row conductor lines, the first conductive plates in each of said rows connected to a respective row conductor line, a plurality of column conductor lines, the second conductive plates in each of said columns connected to a respective column conductor line, a first voltage means for providing a first voltage between said row conductor lines and said substrate to deplete the first portions of said substrate lying under said first conductive plates of majority charge carriers and provide an absolute potential of a first value therein, a second voltage means for providing a second voltage between said column conductor lines and said substrate to deplete the second portions of said substrate lying under said second conductive plates of majority carriers and providing an absolute potential of a second value therein, said second value being greater than said first value, means for storing charge in said first portions of said substrate, means for addressing each pair of adjacent rows in sequence during a respective first period of time, each row line being included in two successive pairs of rows whereby each row is addressed during an initial first period and also during a succeeding first period, means for decreasing said second voltage on said column lines to said zero reference level at the end of each of said first periods, means for increasing said second voltage on each of said column conductor lines in sequence during each of said first periods of time to deplete respective second portions of said substrate lying thereunder of majority charge carriers to provide an absolute potential in said second portions of said second value therein whereby charge stored in each of said first portions of said pair of addressed rows transfers into respective second portions thereof, means for decreasing said first voltage on each of said row lines of said addressed row to zero reference level for an interval at the end of said initial first period thereof after all of said column lines have been reduced to zero reference level to cause charge in said first portions of the substrate associated with said addressed row to be injected into said substrate, means for sensing in sequence the signals induced on each of said pair of row lines during the transfer of charge from the second portions to the first portions of said substrate associated with said pair of addressed rows, means for obtaining a difference signal for each pair of signals appearing on the row lines of said addressed pair of rows.

3. In combination, a substrate of semiconductor material having a major surface, a plurality of first conductive plates, each overlying and in insulated relationship to said major surface and forming a first conductor-insulator-semiconductor capacitor with said substrate, a plurality of second conductive plates, each adjacent a respective first conductive plate to form a plurality of pairs of plates, said pairs of plates being arranged in a matrix of rows and columns, each of said second conductive plates overlying and in insulated relationship to said major surface and forming a second conductor-insulator-semiconductor capacitor with said substrate, each coupled to a respective first conductor-insulator-semiconductor capacitor, a plurality of row conductor lines, the first conductive plates in each of said rows connected to a respective row conductor line, a plurality of column conductor lines, the second conductive plates in each of said columns connected to a respective column conductor line, a first voltage means for providing a first voltage between said row conductor lines and said substrate to deplete the first portions of said substrate lying under said first conductive plates of majority charge carriers and provide an absolute potential of a first value therein, a second voltage means for providing a second voltage between said column conductor lines and said substrate to deplete the second portions of said substrate lying under said second conductive plates of majority carriers and providing an absolute potential of a second value therein, said second value being greater than said first value, means for storing charge in said first portions of said substrate, means for addressing each of said rows of devices in sequence during a respective first period of time, means for decreasing said second voltage on said column lines to said zero reference level at the end of each of said first periods, means for increasing said second voltage on each of said column conductor lines in sequence during each of said first periods of time to deplete respective second portions of said substrate lying thereunder of majority charge carriers to provide an absolute potential in said second portions of second value therein whereby charge stored in each of said first portions of an addressed row of devices transfers into a respective second portion thereof, means for decreasing said first voltage on the row lines of said addressed row to zero reference level for an interval at the end of the first period thereof after all of said column lines have been reduced to zero reference level to cause charge in said first portions of the substrate associated with said addressed row to be injected into said substrate, means for sensing in sequence the currents induced on the row line of each addressed row during the transfer of charge from the second portions to the first portions of said substrate associated therewith.

4. In combination, a substrate of semiconductor material having a major surface, a plurality of first conductive plates, each overlying and in insulated relationship to said major surface and forming a first conductor-insulator-semiconductor capacitor with said substrate, a plurality of second conductive plates, each adjjacent a respective first conductive plate to form a plurality of pairs of plates, said pairs of plates being arranged in a matrix of rows and columns, each of said second conductive plates overlying and in insulated relationship to said major surface and forming a second conductor-insulator-semiconductor capacitor with said substrate, each coupled to a respective first conductor-insulator-semiconductor capacitor, a plurality of row conductor lines, the first conductive plates in each of said rows connected to a respective row conductor line, a plurality of column conductor lines, the second conductive plates in each of said columns connected to a respective column conductor line, a first voltage means for providing a first voltage between said row conductor lines and said substrate to deplete the first portions of said substrate lying under said first conductive plates of majority charge carriers and provide an absolute potential of a first value therein, a second voltage means for providing a second voltage between said column conductor lines and said substrate to deplete the second portions of said substrate lying under said second conductive plates of majority charge carriers and providing an absolute potential of a second value therein, said second value being greater than said first value, means for storing charge in said second portions of said substrate, means for addressing each of said rows of devices in sequence during a respective first period of time, means for decreasing said second voltage on each of said column conductor lines in sequence during said first period for an addressed row to a zero reference level whereby charge stored in each of said second portions of said addressed row is transferred into a respective first portion thereof, means for decreasing said first voltage on the row lines of said addressed row to zero reference level for an interval at the end of the first period thereof to cause charge in said first portions of the substrate associated therewith to be injected into said substrate, means for reestablishing said second voltage on said column conductor lines at the end of each of said first periods after said interval thereof, means for sensing in sequence the currents induced on the row line of each addressed row during the transfer of charge from the second portions to the first portions of said substrate associated therewith.

* * * * *